(12) United States Patent
Jeong et al.

(10) Patent No.: US 9,230,915 B2
(45) Date of Patent: Jan. 5, 2016

(54) SEMICONDUCTOR PACKAGES INCLUDING THROUGH ELECTRODES AND METHODS OF MANUFACTURING THE SAME

(71) Applicant: SK hynix Inc., Icheon-si, Gyeonggi-do (KR)

(72) Inventors: Jung Tae Jeong, Icheon-si (KR); Il Hwan Cho, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 154 days.

(21) Appl. No.: 13/718,636

(22) Filed: Dec. 18, 2012

(65) Prior Publication Data

US 2014/0054772 A1   Feb. 27, 2014

(30) Foreign Application Priority Data

Aug. 27, 2012 (KR) .......................... 10-2012-0093863

(51) Int. Cl.
| | | |
|---|---|---|
| H01L 23/04 | (2006.01) | |
| H01L 23/538 | (2006.01) | |
| H01L 25/00 | (2006.01) | |
| H01L 23/00 | (2006.01) | |
| H01L 23/13 | (2006.01) | |
| H01L 23/48 | (2006.01) | |
| H01L 23/498 | (2006.01) | |
| H01L 23/64 | (2006.01) | |
| H01L 25/065 | (2006.01) | |

(52) U.S. Cl.
CPC ............ *H01L 23/5386* (2013.01); *H01L 23/13* (2013.01); *H01L 23/481* (2013.01); *H01L 23/49805* (2013.01); *H01L 23/64* (2013.01); *H01L 24/01* (2013.01); *H01L 24/05* (2013.01); *H01L 24/72* (2013.01); *H01L 25/0657* (2013.01); *H01L 25/50* (2013.01); *H01L 2224/32225* (2013.01); *H01L 2225/06517* (2013.01); *H01L 2225/06551* (2013.01); *H01L 2225/06565* (2013.01); *H01L 2924/15311* (2013.01); *H01L 2924/181* (2013.01)

(58) Field of Classification Search
USPC .................. 257/698, 738, 686, 678, E23.001, 257/E21.499
See application file for complete search history.

(56) References Cited

U.S. PATENT DOCUMENTS

2010/0123241 A1* 5/2010 Shi et al. ........................ 257/698

FOREIGN PATENT DOCUMENTS

| KR | 10-2009-0034081 A | 4/2009 |
| KR | 10-2010-0030151 A | 3/2010 |
| KR | 10-1037827 B1 | 5/2011 |
| KR | 10-1143637 B1 | 4/2012 |

* cited by examiner

*Primary Examiner* — Timor Karimy
(74) *Attorney, Agent, or Firm* — William Park & Associates Ltd.

(57) ABSTRACT

A semiconductor package includes a substrate and a plurality of semiconductor chips stacked on the substrate. Each of the semiconductor chips has a front surface, a rear surface opposite to the front surface, a sidewall surface connecting the front surface to the rear surface, a vertical through electrode extending from the front surface toward the rear surface with a predetermined depth, and a horizontal through electrode laterally extending from the sidewall surface to be connected to the vertical through electrode. At least one connection member is disposed on the sidewall surfaces of the semiconductor chips to connect the horizontal through electrodes of the semiconductor chips to each other. Related methods are also provided.

9 Claims, 8 Drawing Sheets

SEMICONDUCTOR PACKAGES INCLUDING THROUGH ELECTRODES AND METHODS OF MANUFACTURING THE SAME

CROSS-REFERENCE TO RELATED APPLICATION

The present application claims priority under 35 U.S.C. 119(a) to Korean Application No. 10-2012-0093863, filed on Aug. 27, 2012, in the Korean Intellectual Property Office, which is incorporated herein by reference in its entirety as set forth in full.

BACKGROUND

Embodiments of the present disclosure relate generally to semiconductor packages and methods of manufacturing the same and, more particularly, to semiconductor packages including through electrodes and methods of manufacturing the same.

As demand for small-sized, high-performance and mobile electronic products have recently increased, ultra-small high-capacity semiconductor memory devices are correspondingly desired. In general, ways to increase the storage capacity of the semiconductor memory device include increasing the integration density of a semiconductor chip, or mounting and assembling a plurality of semiconductor chips within a single package. The former method may require much effort, cost, and time, while the latter packaging method may allow for easier ways to increase the storage capacity of the semiconductor memory devices. The latter method is advantageous in terms of costs, research, development effort, and development time, as compared to the former method. Hence, semiconductor memory manufacturers have made efforts to increase the storage capacity of the semiconductor memory device through a multi-chip package which mounts a plurality of semiconductor chips within a single semiconductor package.

A method of mounting the plurality of semiconductor chips within the single semiconductor package includes a method of mounting semiconductor chips horizontally or vertically. However, in order to contribute to smaller electronic products, most semiconductor memory manufacturers prefer a stack type multi-chip package in which semiconductor chips are stacked vertically. Most of the multi-chip stack packages may be realized using through silicon vias (TSVs) that penetrate semiconductor chips constituting the multi-chip packages.

In the semiconductor package in which semiconductor chips stacked using the TSVs are electrically connected, the TSVs penetrating the semiconductor chips may constitute electric connection paths. Thus, as the lengths of the electric connection paths decrease, large-capacity data may be advantageously processed at higher speeds. In the multi-chip stack package technology using TSVs, one of the most important steps is to form via holes penetrating semiconductor chips and to stack the semiconductor chips having TSVs at accurate positions. The TSVs may be formed by patterning the semiconductor chip to form via holes penetrating the semiconductor chip and by filling the via holes with a conductive material. That is, the via holes may be formed to completely penetrate a semiconductor chip from a first surface of the semiconductor chip to a second surface of the semiconductor chip opposite to the first surface. Thus, a depth of the via holes may be equal to a thickness of the semiconductor chip. However, it may be difficult to form deep via holes which may slow the development of the multi-chip stack packages. In addition, in the event that misalignment occurs between upper and lower TSVs in forming the multi-chip stack package by stacking a plurality of semiconductor chips having TSVs, an open failure may occur between the semiconductor chips.

Electronic elements constituting the semiconductor chip may be generally categorized as either active elements or passive elements. Active elements may operate in a non-linear characteristic region, and passive elements may operate in a linear characteristic region even if they exhibit both the non-linear characteristic region and the linear characteristic region. Active elements include transistors, and passive elements include capacitors, resistors, inductors, and so on. Passive elements may act as signal filters, and may be generally mounted on an arbitrary region such as a peripheral region of a package substrate on which a semiconductor package is mounted. However, passive elements mounted on the peripheral region of the package substrate may require additional area on a mother board and may considerably lower packing density of semiconductor packages.

SUMMARY

Various embodiments are directed to semiconductor packages and methods of manufacturing the same.

According to an embodiment of the present invention, a semiconductor package includes a substrate and a plurality of semiconductor chips stacked on the substrate. Each of the semiconductor chips has a front surface, a rear surface opposite to the front surface, a sidewall surface connecting the front surface to the rear surface, a vertical through electrode extending from the front surface toward the rear surface with a predetermined depth, and a horizontal through electrode laterally extending from the sidewall surface to be connected to the vertical through electrode. At least one connection member is disposed on the sidewall surfaces of the semiconductor chips to connect the horizontal through electrodes of the semiconductor chips to each other.

In another embodiment of the present invention, the number of semiconductor chips stacked on the substrate may be an even or odd number.

In another embodiment of the present invention, a bottom-most semiconductor chip may be mounted in a flip-chip manner such that the vertical through electrode faces the substrate.

In another embodiment of the present invention, the connection member may be an interconnection line formed of a conductive wire or a conductive film pattern.

In another embodiment of the present invention, the connection member may be a passive element.

In another embodiment of the present invention, the semiconductor chip may further include an external connection terminal disposed on a surface of the substrate opposite to the semiconductor chips.

In another embodiment of the present invention, the external connection terminal may be a solder ball.

In another embodiment of the present invention, a semiconductor package includes a substrate having a cavity therein and a plurality of semiconductor chips mounted in the cavity. Each of the semiconductor chips has a front surface, a rear surface opposite to the front surface, a sidewall surface connecting the front surface to the rear surface, a vertical through electrode extending from the front surface toward the rear surface with a predetermined depth, and a horizontal through electrode laterally extending from the sidewall surface to be connected to the vertical through electrode. At least one connection member is disposed in a sidewall of the cavity to connect the horizontal through electrodes of the semiconductor chips to each other.

In another embodiment of the present invention, the number of the semiconductor chips mounted in the cavity may be an even or odd number.

In another embodiment of the present invention, a bottom-most semiconductor chip may be mounted in a flip-chip manner such that the vertical through electrode faces the substrate.

In another embodiment of the present invention, the connection member may be an interconnection line formed of a conductive film pattern embedded in the substrate.

According to another embodiment of the present invention, a method of manufacturing a semiconductor package includes forming a plurality of semiconductor chips. Each of the plurality of semiconductor chips is formed to include a front surface, a rear surface opposite to the front surface, a sidewall surface connecting the front surface to the rear surface, a vertical through electrode extending from the front surface toward the rear surface with a predetermined depth, and a horizontal through electrode laterally extending from the sidewall surface to be connected to the vertical through electrode. The pluralities of semiconductor chips are stacked on a substrate. The horizontal through electrodes of the plurality of semiconductor chips are electrically connected to each other by at least one connection member. The vertical through electrode and the horizontal through electrode constitute a through electrode.

In another embodiment of the present invention, stacking the semiconductor chips on the substrate may include stacking a first semiconductor chip corresponding to a bottommost semiconductor chip in a flip-chip manner such that the front surface of the first semiconductor chip faces the substrate to directly connect the vertical through electrode to the substrate.

In another embodiment of the present invention, stacking the semiconductor chips on the substrate may include stacking a second semiconductor chip stacked on the first semiconductor chip such that the rear surface of the second semiconductor chip faces the rear surface of the first semiconductor chip, and the first and second semiconductor chips may be electrically connected to each other by the horizontal through electrodes thereof and the connection member.

In another embodiment of the present invention, odd-numbered semiconductor chips of the plurality of stacked semiconductor chips may be stacked in a flip-chip manner, and even-numbered semiconductor chips of the plurality of stacked semiconductor chips may be stacked such that the front surfaces of the even-numbered semiconductor chips face upward.

In another embodiment of the present invention, the connection member may be an interconnection line formed of a conductive wire or a conductive film pattern.

In another embodiment of the present invention, the connection member may be a passive element.

In another embodiment of the present invention, the substrate may be a printed circuit board including a cavity in which the plurality of semiconductor chips are mounted, and the connection member may be a connecting wire disposed in an sidewall of the cavity.

In another embodiment of the present invention, the connecting wire may include a first connecting portion connecting the horizontal through electrodes of the semiconductor chips to each other and a second connecting portion connecting the first connecting portion to the substrate.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1:
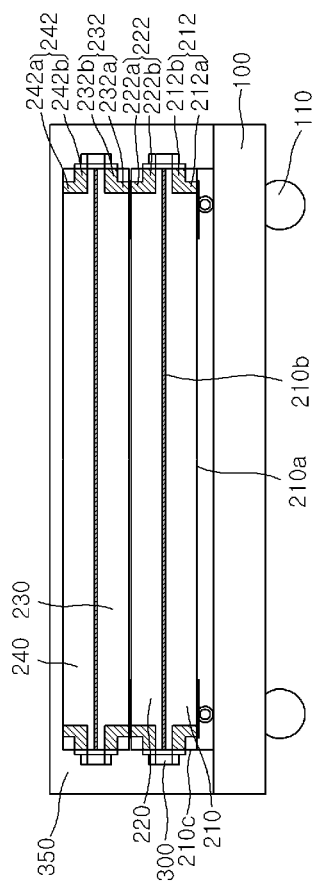
FIG. 1 is a cross sectional view illustrating a semiconductor package according to an embodiment of the present invention.

Various embodiments will now be described more fully with reference to the accompanying drawings, in which various embodiments are shown. In the drawings, like reference designators in the drawings denote like or corresponding elements.

FIG. 1 is a cross sectional view illustrating a semiconductor package according to an embodiment of the present invention.

Referring to FIG. 1, the semiconductor package may include a substrate 100, a plurality of semiconductor chips 210, 220, 230, and 240 stacked on the substrate 100, and connection members 300 disposed on sidewalls of the semiconductor chips 210, 220, 230, and 240 to electrically connect the semiconductor chips 210, 220, 230, and 240 to each other. Although FIG. 1 illustrates four semiconductor chips which are stacked, the number of semiconductor chips stacked on the substrate 100 is not limited to four. In another embodiment, the number of semiconductor chips stacked on the substrate 100 may be an even or odd number.

The substrate 100 may be a package substrate such as a printed circuit board (PCB) having interconnection lines embedded therein. Pads or redistributed lines to be connected with the semiconductor chips may be disposed on a first surface of the substrate 100 on which the semiconductor chips are mounted, and solder balls 110 as external connection terminals may be disposed on a second surface of the substrate 100 opposite to the first surface.

In another embodiment of the present invention, the semiconductor chips 210, 220, 230, and 240 may have substantially similar configurations. Thus, the configuration of the first semiconductor chip 210 will be described in detail and the configurations of the second to fourth semiconductor chips 220, 230, and 240 will be briefly described to avoid duplicate explanation. The first semiconductor chip 210 may include a front surface 210a, a rear surface 210b opposite to the front surface 210a, and a sidewall surface 210c. The front surface 210a of the first semiconductor chip 210 may include active regions in and/or on which a memory device such as a DRAM device is disposed. Various elements such as transistors may be integrated in the active regions. In addition, chip select logic units for chip selection may be integrated in the active regions. Connection pads as connection terminals, for example, may be disposed on a region (e.g., a field region) other than the active regions, and through electrodes 212 as electrical connection terminals may be disposed in peripheral regions of the first semiconductor chip 210.

Each of the through electrodes 212 may be, for example, a through silicon via (TSV) and may act as an address signal path, a power supply line, or a data signal line. As shown in FIG. 1, each of the through electrodes 212 may include a vertical through electrode 212a and a horizontal through electrode 212b. The vertical through electrode 212a may vertically extend from the front surface 210a toward the rear surface 210b, but not make contact with the rear surface 210b. In another embodiment of the present invention, the vertical through electrode 212a may have a vertical length which is half a thickness of the first semiconductor chip 210. The horizontal through electrode 212b may be disposed to laterally extend from the sidewall surface 210c into a bulk region of the first semiconductor chip 210 to make contact with an end of the vertical through electrode 212a. Accordingly, the through electrode 212 may have an "L"-shaped configuration. Similarly, the second semiconductor chip 220 may include through electrodes 222, the third semiconductor chip 230 may include through electrodes 232, and the fourth semiconductor chip 240 may include through electrodes 242. Each of the through electrodes 222 may include a vertical through electrode 222a and a horizontal through electrode 222b, each of the through electrodes 232 may include a vertical through electrode 232a and a horizontal through electrode 232b, and each of the through electrodes 242 may include a vertical through electrode 242a and a horizontal through electrode 242b.

The first semiconductor chip 210 may be mounted on the substrate 100 in a flip-chip manner such that connection pads (not shown) disposed on the package substrate 100 are connected to the vertical through electrodes 212a of the first semiconductor chip 210. In addition, the second semiconductor chip 220 may be stacked on the first semiconductor chip 210 such that the rear surface of the second semiconductor chip 220 faces the rear surface of the first semiconductor chip 210, and the third semiconductor chip 230 may be flipped and stacked on the second semiconductor chip 220 such that the vertical through electrodes 232a of the third semiconductor chip 230 are connected to the vertical through electrodes 222a of the second semiconductor chip 220. Further, the fourth semiconductor chip 240 may be stacked on the third semiconductor chip 230 such that the rear surface of the fourth semiconductor chip 240 faces the rear surface of the third semiconductor chip 230. The connection members 300 may be disposed on the sidewall surfaces of the semiconductor chips 210, 220, 230, and 240.

Some of the connection members 300 may electrically connect the horizontal through electrodes 212b of the first semiconductor chip 210 to the horizontal through electrodes 222b of the second semiconductor chip 220, and other connection members 300 may electrically connect the horizontal through electrodes 232b of the third semiconductor chip 230 to the horizontal through electrodes 242b of the fourth semiconductor chip 240. As a result, the first to fourth semiconductor chips 210, 220, 230, and 240 may be electrically connected to each other by the through electrodes 212, 222, 232, and 242 and the connection members 300.

The connection members 300 may be passive elements such as capacitors, resistors, inductors, or the like. Thus, the connection members 300 may improve signal processing speeds of the semiconductor chips 210, 220, 230 and 240 or may filter electrical signals.

An under-fill material may fill a portion between the substrate 100 and the first semiconductor chip 210, and the semiconductor chips 210, 220, 230, and 240 may be encapsulated with a molding member 350 such as an epoxy molding compound (EMC) material.

Figure 2:
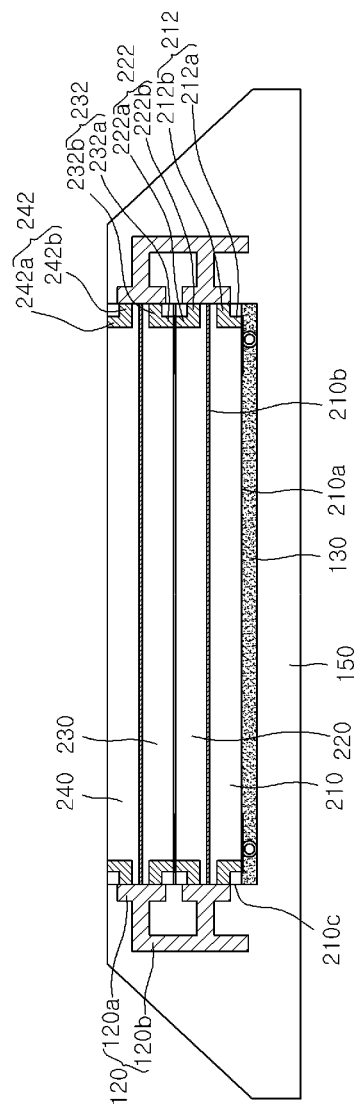
FIG. 2 is a cross sectional view illustrating a semiconductor package according to another embodiment of the present invention.

FIG. 2 is a cross sectional view illustrating a semiconductor package according to another embodiment of the present invention.

Referring to FIG. 2, the semiconductor package may include a substrate 150, a plurality of semiconductor chips 210, 220, 230, and 240 stacked on the substrate 150, and connection members 120 disposed on sidewall surfaces of the semiconductor chips 210, 220, 230, and 240. Although FIG. 2 illustrates four semiconductor chips which are stacked, the various embodiments do not limit the number of semiconductor chips stacked on the substrate 100 to four. The number of semiconductor chips stacked on the substrate 100 may be an even or odd number.

The substrate 150 may be a package substrate such as a printed circuit board (PCB) having interconnection lines embedded therein. A cavity is formed in one surface of the substrate 150 to provide a space in which the semiconductor chips 210, 220, 230, and 240 are placed. The connection members 120 may be disposed on sidewalls of the substrate 150 to electrically connect the semiconductor chips 210, 220, 230, and 240 to each other. The connection members 120 may be connecting wires, and each of the connection members 120 may include a pair of first connecting portions 120a and a second connecting portion 120b. One of the pair of first connecting portions 120a may electrically connect the first semiconductor chip 210 to the second semiconductor chip 220, and the other pair of first connecting portions 120a may electrically connect the third semiconductor chip 230 to the fourth semiconductor chip 240. The second connecting portion 120b may electrically connect the pair of first connecting portions 120a to the substrate 150. The number of the first connecting portions 120a may be determined according to the number of the semiconductor chips disposed in the cavity.

In another embodiment of the present invention, the semiconductor chips 210, 220, 230, and 240 may have substantially similar configurations. Thus, the configuration of the first semiconductor chip 210 will be described in detail and the configurations of the second to fourth semiconductor chips 220, 230, and 240 will be briefly described to avoid duplicate explanation. The first semiconductor chip 210 may include a front surface 210a, a rear surface 210b opposite to the front surface 210a, and a sidewall surface 210c. The front surface 210a of the first semiconductor chip 210 may include active regions in and/or on which a memory device such as a DRAM device is disposed. Various elements such as transistors may be integrated in the active regions. In addition, chip select logic units for chip selection may be integrated in the active regions. Connection pads as connection terminals, for example, may be disposed on a region (e.g., a field region) other than the active regions, and through electrodes 212 as electrical connection terminals may be disposed in peripheral regions of the first semiconductor chip 210.

Each of the through electrodes 212 may be, for example, a through silicon via (TSV) and may act as an address signal path, a power supply line, or a data signal line. As shown in FIG. 1, each of the through electrodes 212 may include a vertical through electrode 212a and a horizontal through electrode 212b. The vertical through electrode 212a may vertically extend from the front surface 210a toward the rear surface 210b, but not make contact with the rear surface 210b. In another embodiment of the present invention, the vertical through electrode 212a may have a vertical length which is half a thickness of the first semiconductor chip 210. The horizontal through electrode 212b may be disposed to laterally extend from the sidewall surface 210c into a bulk region of the first semiconductor chip 210 to make contact with an end of the vertical through electrode 212a. Accordingly, the through electrode 212 may have an "L"-shaped configuration. Similarly, the second semiconductor chip 220 may include through electrodes 222, the third semiconductor chip 230 may include through electrodes 232, and the fourth semiconductor chip 240 may include through electrodes 242. Each of the through electrodes 222 may include a vertical through electrode 222a and a horizontal through electrode 222b, each of the through electrodes 232 may include a vertical through electrode 232a and a horizontal through electrode 232b, and each of the through electrodes 242 may include a vertical through electrode 242a and a horizontal through electrode 242b.

The first to fourth semiconductor chips 210, 220, 230, and 240 may be stacked in the cavity of the substrate 150 to have a similar configuration as described with reference to FIG. 1. That is, the first semiconductor chip 210 may be flipped and disposed on a bottom surface of the cavity such that connection pads (not shown) of the package substrate 150 are connected to the vertical through electrodes 212a of the first semiconductor chip 210, and the second semiconductor chip 220 may be stacked on the first semiconductor chip 210 such that the rear surface of the second semiconductor chip 220 faces the rear surface of the first semiconductor chip 210.

Further, the third semiconductor chip 230 may be flipped and stacked on the second semiconductor chip 220 such that the vertical through electrodes 232a of the third semiconductor chip 230 are connected to the vertical through electrodes 222a of the second semiconductor chip 220, and the fourth semiconductor chip 240 may be stacked on the third semiconductor chip 230 such that the rear surface of the fourth semiconductor chip 240 faces the rear surface of the third semiconductor chip 230.

The horizontal through electrodes 212b of the first semiconductor chips 210 may be electrically connected to the horizontal through electrodes 222b of the second semiconductor chip 220 via the connection members 120 disposed in the substrate 150, and the horizontal through electrodes 232b of the third semiconductor chips 230 may be electrically connected to the horizontal through electrodes 242b of the fourth semiconductor chip 240 via the connection members 120 disposed in the substrate 150. As a result, the first to fourth semiconductor chips 210, 220, 230, and 240 may be electrically connected to each other through the connection members 120. An adhesive film 130 or the like may be disposed between the bottom surface of the cavity and the front surface 210a of the first semiconductor chip 210. That is, the first semiconductor chip 210 may be attached to the bottom surface of the cavity using the adhesive film 130.

As described above, the semiconductor packages according to various embodiments may include through electrodes having a vertical length approximately half the thickness of the semiconductor chips. In addition, the horizontal through electrodes may be connected to each other using connection members such as passive elements. The through electrodes may be more readily formed since the vertical length of the through electrodes may be less than the thickness of the semiconductor chips, and misalignment between the through electrodes of the semiconductor chips may be prevented. Further, since signal paths are shortened, high-speed operation may be advantageously achieved. Moreover, relatively compact, slim, and lightweight packages may be advantageously achieved by reducing the mounting area occupied by passive elements.

FIGS. 3 to 7 are cross sectional views illustrating a method for manufacturing a semiconductor package according to another embodiment of the present invention.

Figure 3:
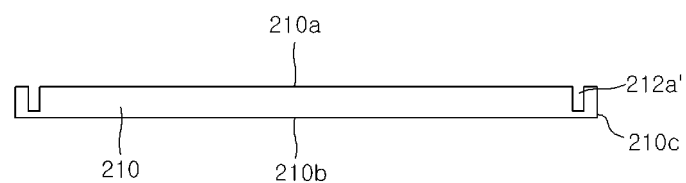
FIGS. 3 to 7 are cross sectional views illustrating a method for manufacturing a semiconductor package according to another embodiment of the present invention.

Referring to FIG. 3, the semiconductor chip 210 may be formed to include a front surface 210a, a rear surface 210b, and sidewall surfaces 210c. The front surface 210a and the rear surface 210b may be displayed in an opposite manner to each other. The semiconductor chip 210 may be provided by forming a plurality of semiconductor devices on a semiconductor wafer using general semiconductor fabrication processes, back-grinding a backside of the wafer having the semiconductor devices, and sawing the wafer to separate the semiconductor devices from each other. Although not shown in the drawings, the front surface 210a of the semiconductor chip 210 may include active regions in and/or on which a DRAM device including memory banks is formed, and elements such as transistors may be integrated in the active regions. Further, chip select logic units for chip selection may be integrated in the active regions.

Subsequently, the semiconductor chip 210 may be etched to a predetermined depth from the front surface 210a, thereby forming vertical TSV holes 212a. The vertical TSV holes 212a may not penetrate the semiconductor chip 210 completely through. For example, the vertical TSV holes 212a may be formed to have an appropriate depth which is approximately half (½) the thickness of the semiconductor chip 210. The vertical TSV holes 212a may be connected to horizontal TSV holes which are formed to laterally penetrate the sidewall surfaces 210c of the semiconductor chip 210 in a subsequent process.

Figure 4:
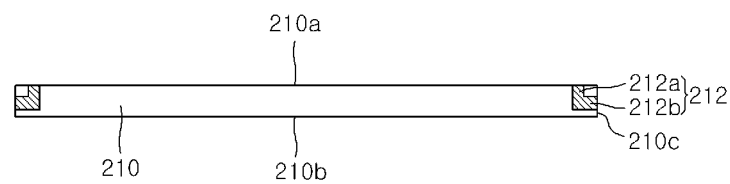

Referring to FIG. 4, horizontal TSV holes may be formed in edges of the semiconductor chip 210. The horizontal TSV holes 212b may be formed to extend from the sidewall surfaces 210c toward an internal region of the semiconductor chip 210. The locations and depths of the horizontal TSV holes 212b may be determined such that the horizontal TSV holes 212b are spatially connected to the vertical TSV holes 212a. After forming the vertical TSV holes 212a and the horizontal TSV holes 212b, the vertical TSV holes 212a and the horizontal TSV holes 212b may be filled with a conductive material to form "L"-shaped through electrodes 212. Accordingly, each of the through electrodes 212 may be formed to include a vertical through electrodes (e.g., vertical TSV holes 212a) and a horizontal through electrode (e.g., horizontal TSV holes 212b).

In another embodiment, the through electrodes 212 may be formed using an electroplating process.

Figure 5:
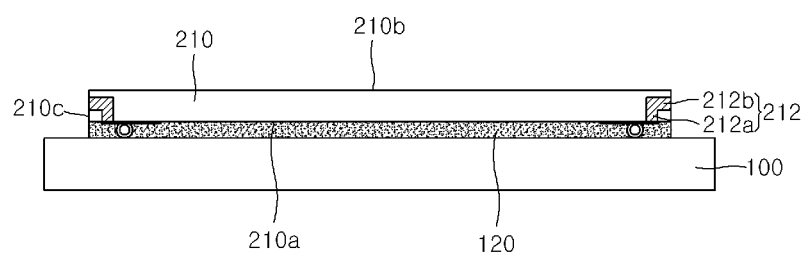

Referring to FIG. 5, the first semiconductor chip 210 having the through electrodes 212 may be mounted on a package substrate 100 using for example an adhesive film or an adhesive agent. In such a case, to directly connect connection pads (not shown) disposed on the package substrate 100 to the vertical through electrodes 212a of the first semiconductor chip 210, the first semiconductor chip 210 may be mounted on the package substrate 100 in a flip-chip manner such that the front surface 210a of the first semiconductor chip 210 faces downward. After the first semiconductor chip 210 is stacked on the package substrate 100, an under-filling process may be performed to fill a space between the package substrate 100 and the first semiconductor chip 210 with an under-fill material. Alternatively, after the under-filling process is performed using a material such as anisotropic conductive paste (ACP), an anisotropic conductive film (ACF), a non-conductive film (NCF), or a non-conductive paste (NCP), the first semiconductor chip 210 may be bonded to the package substrate 100 in a flip-chip manner.

Figure 6:
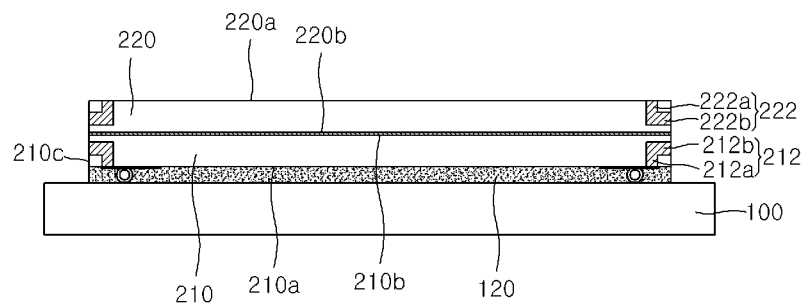
Figure 7:
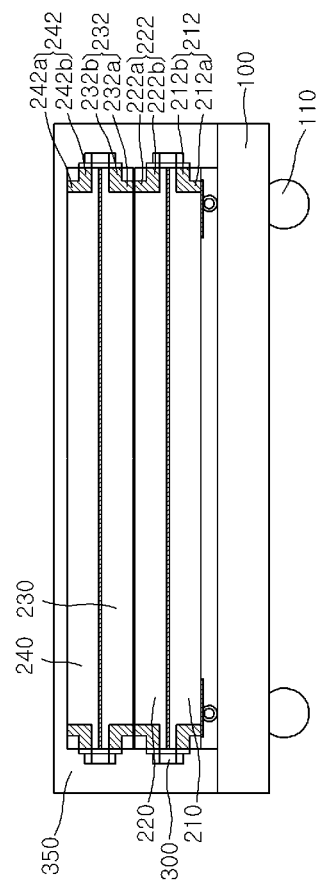

Referring to FIGS. 6 and 7, a second semiconductor chip 220 may be stacked on the rear surface 210b of the first semiconductor chip 210 opposite to the package substrate 100, and connection members 300 such as passive elements may be attached to the sidewall surfaces 210c of the first semiconductor chip 210 and the second semiconductor chip 220. The second semiconductor chip 220 may be formed to have a substantially similar configuration as the first semiconductor chip 210. That is, the second semiconductor chip 220 may also be formed to have through electrodes 222 including vertical through electrodes 222a and horizontal through electrodes 222b.

Unlike the first semiconductor chip 210 mounted in a flip-chip manner, the second semiconductor chip 220 may be stacked on the first semiconductor chip 210 such that the front surface 220a of the second semiconductor chip 220 faces upward. Therefore, the rear surface 210b of the first semiconductor chip 210 may be in contact with a rear surface 220b of the second semiconductor chip 220. As such, the first semiconductor chip 210 and the second semiconductor chip 220 are electrically connected to each other through the connection members 300, and the second semiconductor chip 220 and semiconductor chips stacked thereon may be connected to each other through the vertical through electrodes 222a.

A third semiconductor chip 230 and a fourth semiconductor chip 240 may be sequentially stacked on the second semiconductor chip 220. The third and fourth semiconductor chips 230 and 240 may be formed to have a substantially similar configuration as the first semiconductor chip 210. That is, the third semiconductor chip 230 may be formed to have through electrodes 232 including vertical through electrodes 232a and horizontal through electrodes 232b, and the fourth semiconductor chip 240 may be formed to have through electrodes 242 including vertical through electrodes 242a and horizontal through electrodes 242b. The third semiconductor chip 230 may be stacked in a flip-chip manner similar to that of the first semiconductor chip 210, and the fourth semiconductor chip 240 may be stacked such that a front surface of the fourth semiconductor chip 240 faces upward similar to that of the second semiconductor chip 220. As a result, odd-numbered semiconductor chips of the plurality of stacked semiconductor chips may be stacked in a flip-chip manner, and even-numbered semiconductor chips of the plurality of stacked semiconductor chips may be stacked such that the front surfaces of the even-numbered semiconductor chips face upward.

Connection members 300 such as other passive elements may be attached to sidewall surfaces of the third and fourth semiconductor chips 230 and 240 to electrically connect the horizontal through electrodes 232b of the third semiconductor chip 230 to the horizontal through electrodes 242b of the fourth semiconductor chip 240. Similar to the method of stacking the first and second semiconductor chips 210 and 220, the third semiconductor chip 230 may also be stacked on the second semiconductor chip 220 in a flip-chip manner to electrically connect the vertical through electrodes 232a of the third semiconductor chip 230 to the vertical through electrodes 222a of the second semiconductor chip 220. In addition, unlike the third semiconductor chip 230, the fourth semiconductor chip 240 may be stacked on the third semiconductor chip 230 such that a front surface of the fourth semiconductor chip 240 faces upward. As the horizontal through electrodes 232b and 242b of the third and fourth semiconductor chips 230 and 240 are connected to the connection members 300, the third semiconductor chip 230 and the fourth semiconductor chip 240 are electrically connected to each other through the connection members 300. Although FIG. 7 shows only four stacked semiconductor chips 210, 220, 230, and 240, the embodiments do not limit the number of semiconductor chips stacked.

After all the semiconductor chips 210, 220, 230, and 240 are stacked, a molding member 350 such as an epoxy molding compound (EMC) material may be formed to encapsulate the stacked semiconductor chips 210, 220, 230, and 240.

FIGS. 8 to 11 are cross sectional views illustrating a method for manufacturing a semiconductor package according to another embodiment of the present invention. In FIGS. 8 to 11, substantially similar reference designators as illustrated in FIGS. 3 to 7 indicate substantially similar elements.

Figure 8:
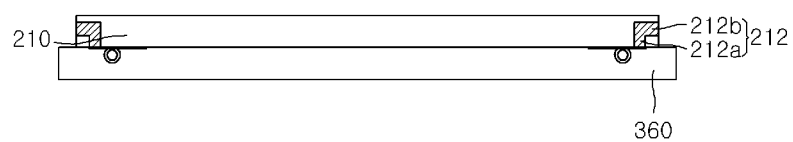
FIGS. 8 to 11 are cross sectional views illustrating a method for manufacturing a semiconductor package according to another embodiment of the present invention.

Referring to FIG. 8, a first semiconductor chip 210 may be formed using a similar manner as described in the previous embodiments. That is, the first semiconductor chip 210 may be formed to have "L"-shaped through electrodes 212 including vertical through electrodes 212a and horizontal through electrodes 212b, and collectively may be mounted on a temporary substrate 360. The temporary substrate 360 may be, for example, a detach film, and may be used to support a plurality of semiconductor chips stacked thereon. As the name implies, the temporary substrate 360 may be removed before the stacked semiconductor chips are finally mounted on a package substrate. The first semiconductor chip 210 may be stacked on the temporary substrate 360 in a flip-chip manner such that a front surface exposing the vertical through electrodes 212a faces the temporary substrate 360.

Figure 9:
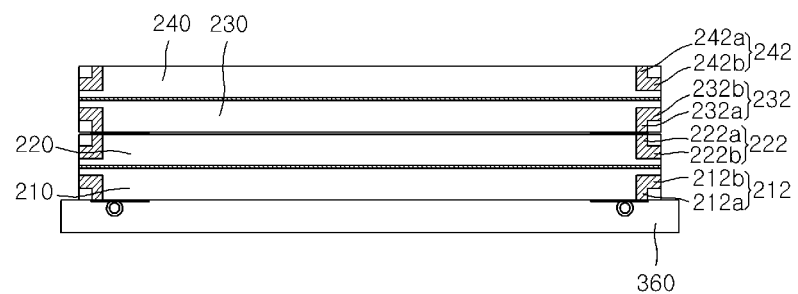

Referring to FIG. 9, second, third, and fourth semiconductor chips 220, 230, and 240 may be sequentially stacked on a rear surface of the first semiconductor chip 210 opposite to the temporary substrate 360, and may be stacked in a similar manner as described in previous embodiments illustrated in FIGS. 3 to 7. That is, the second semiconductor chip 220 may be stacked on the first semiconductor chip 210 such that a rear surface of the second semiconductor chip 220 faces a rear surface of the first semiconductor chip 210, the third semiconductor chip 230 may be stacked on the second semiconductor chip 220 in a flip-chip manner such that vertical through electrodes 232a of the third semiconductor chip 230 is directly connected to vertical through electrodes 222a of the second semiconductor chip 220, and the fourth semiconductor chip 240 may be stacked on the third semiconductor chip 230 such that a rear surface of the fourth semiconductor chip 240 faces a rear surface of the third semiconductor chip 230. In the illustrated embodiment of FIG. 9, four semiconductor chips are stacked. However, five or more semiconductor chips may also be stacked in a similar manner as the first to fourth semiconductor chips 210, 220, 230, and 240 illustrated herein.

Figure 10:
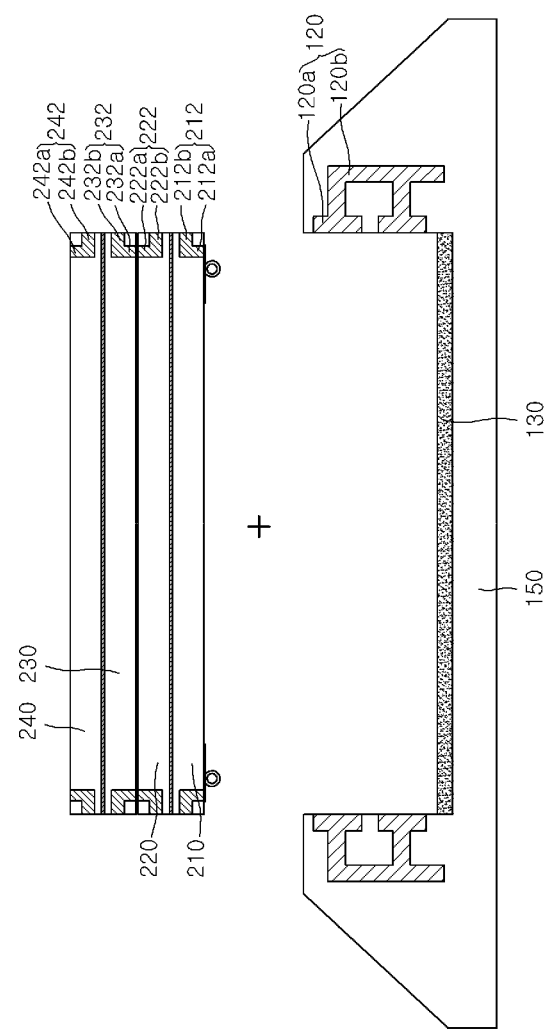

Referring to FIG. 10, after sequentially stacking the first to fourth semiconductor chips 210, 220, 230, and 240 on the temporary substrate 360, the temporary substrate 360 may be detached from the first semiconductor chip 210, and a package substrate 150 may be prepared. The package substrate 150 may be, for example, a printed circuit board (PCB) having circuit patterns embedded therein. The package substrate 150 may be prepared to include a cavity into which the semiconductor chips 210, 220, 230, and 240 may be inserted with connection members 120 disposed on sidewalls thereof. In an embodiment of the present invention, the connection members 120 may be interconnection lines or passive elements. The connection members 120 may electrically connect the horizontal through electrodes 212b, 222b, 232b, and 242b formed in edges of the semiconductor chips 210, 220, 230, and 240, respectively. An adhesive film 130 or an adhesive agent may be disposed on a bottom surface of the cavity to adhere the semiconductor chips 210, 220, 230, and 240 to the package substrate 150. The connection members 120 may be electrically connected to the circuit patterns embedded in the package substrate 150, and each may include a pair of first connecting portions 120a and a second connecting portion 120b electrically connecting one of the first connecting portions 120a to the other within the pair of first connecting portions 120a. One of the first connecting portions 120a may be formed to electrically connect the horizontal through electrode 212b of the first semiconductor chip 210 to the horizontal through electrode 222b of the second semiconductor chip 220, and the other pair of first connecting portions 120a may be formed to electrically connect the horizontal through electrode 232b of the third semiconductor chip 230 to the horizontal through electrode 242b of the fourth semiconductor chip 240. Thus, in the event that four semiconductor chips are stacked, each of the connection members 120 may include two first connecting portions. Accordingly, if the number of the stacked semiconductor chips increases, the number of first connecting portions constituting each connection member may also increase.

Figure 11:
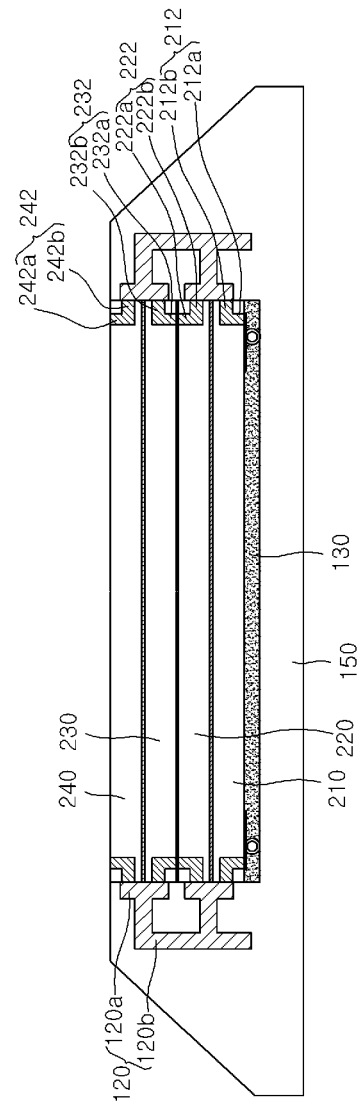

Referring to FIG. 11, the semiconductor chips 210, 220, 230, and 240 may be inserted into the cavity of the package substrate 150. As the adhesive film disposed on the bottom surface of the cavity is adhered to the first semiconductor chip 210, the plurality of semiconductor chips 210, 220, 230, and 240 may be mounted on the package substrate 150. Subsequently, the first to fourth semiconductor chips 210, 220, 230, and 240 may be electrically connected to each other by the connection members 120 disposed on sidewalls of the package substrate 150.

According to embodiments set forth above, a through electrode may include a vertical through electrode extending from a front surface of a semiconductor chip into the semiconductor chip and a horizontal through electrode laterally extending from a sidewall surface of the semiconductor chip to make contact with the vertical through electrode. The vertical through electrode may have a vertical length of approximately half the thickness of the semiconductor chip. Thus, the through electrode may be more readily formed because the vertical length of the through electrode is less than the thickness of the semiconductor chip. In addition, when a plurality of semiconductor chips are mounted on a substrate and each of the semiconductor chips has the vertical through electrode and the horizontal through electrode, the horizontal through electrodes of the stacked semiconductor chips may be electrically connected by at least one connection member such as a passive element disposed on sidewall surfaces of the stacked semiconductor chips. Thus, misalignment between the through electrodes of the semiconductor chips may be prevented. Further, since signal paths are shortened, high-speed operation may be advantageously achieved. Moreover, relatively compact, slim, and lightweight packages may be advantageously achieved by reducing the mounting area occupied by the passive element.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor package comprising:
a substrate;
a plurality of semiconductor chips stacked on the substrate, each of the semiconductor chips having a front surface, a rear surface opposite to the front surface, a sidewall surface connecting the front surface to the rear surface, a through electrode extending from the front surface toward the sidewall surface, wherein the through electrode includes a vertical through electrode and a horizontal through electrode, wherein the vertical through electrode extends from the front surface toward the rear surface with a predetermined depth, but the vertical through electrode does not make contact with the rear surface, and the horizontal through electrode laterally extends from an end of the vertical through electrode toward the sidewall surface, wherein the horizontal through electrode has the same level with the sidewall surface; and
at least one connection member disposed on the sidewall surfaces of the semiconductor chips to connect the horizontal through electrode of the through electrodes of the semiconductor chips to each other,
wherein vertical through electrodes located at front surfaces, of adjacent semiconductor chips wherein the front surfaces face each other, are directly connected to each other, and
wherein horizontal through electrodes located at sidewall surfaces, of semiconductor chips having respective rear surfaces facing each other and adjacent to each other, are coupled through connection members.

2. The semiconductor package of claim 1, wherein the number of the semiconductor chips stacked on the substrate is an even or odd number.

3. The semiconductor package of claim 2, wherein a bottommost semiconductor chip is mounted in a flip-chip manner such that the vertical through electrode faces the substrate.

4. The semiconductor package of claim 1, wherein the connection member is an interconnection line formed of a conductive wire or a conductive film pattern.

5. The semiconductor package of claim 1, wherein the connection member is a passive element.

6. The semiconductor package of claim 1, further comprising an external connection terminal disposed on a surface of the substrate opposite to the semiconductor chips.

7. The semiconductor package of claim 6, wherein the external connection terminal is a solder ball.

8. The semiconductor package of claim 1, further comprising a molding member which encapsulates the plurality of semiconductor chips stacked on the substrate.

9. The semiconductor package of claim 1, wherein the through electrode including the vertical through electrode and the horizontal through electrode has an L-shaped configuration.

* * * * *